US006922128B2

(12) United States Patent
Vilander et al.

(10) Patent No.: US 6,922,128 B2
(45) Date of Patent: Jul. 26, 2005

(54) METHOD FOR FORMING A SPIRAL INDUCTOR

(75) Inventors: Ari Vilander, Kerava (FI); Mikael Svard, Andersböle (FI); Lassi Hyvonen, Helsinki (FI)

(73) Assignee: Nokia Corporation, Espoo (FI)

( * ) Notice: Subject to any disclaimer, the term of this patent is extended or adjusted under 35 U.S.C. 154(b) by 313 days.

(21) Appl. No.: 10/176,101

(22) Filed: Jun. 18, 2002

(65) Prior Publication Data

US 2003/0229982 A1 Dec. 18, 2003

(51) Int. Cl.[7] .................................................. H01F 5/00
(52) U.S. Cl. .................. 336/200; 29/602.1; 29/603.13; 29/603.14; 29/603.15; 29/603.16; 29/606; 29/609; 257/531; 336/65; 336/83; 336/223; 336/232; 427/127; 427/128
(58) Field of Search .............. 29/602.1, 603.13–603.16, 29/606, 609; 336/65, 83, 200, 223, 232, 2; 257/531; 427/127, 128

(56) References Cited

U.S. PATENT DOCUMENTS

| | | | | |
|---|---|---|---|---|
| 4,816,784 A | * | 3/1989 | Rabjohn | 333/24 R |
| 5,225,969 A | * | 7/1993 | Takaya et al. | 361/795 |
| 5,781,071 A | * | 7/1998 | Kusunoki | 330/269 |
| 6,114,937 A | | 9/2000 | Burghartz et al. | 336/200 |
| 6,310,387 B1 | | 10/2001 | Seefeldt et al. | 257/531 |
| 6,355,491 B1 | * | 3/2002 | Zhou et al. | 436/518 |
| 6,801,114 B2 | * | 10/2004 | Yang et al. | 336/200 |

FOREIGN PATENT DOCUMENTS

JP  0581615 A  *  4/1993

OTHER PUBLICATIONS

"Nanoliter volume, high–resolution NMR microspectroscopy using a 60–μm planar microcoil"; Stocker, J.E.; Peck, T.L.; Webb, A.G.; Feng, M.; Magin, R.L.; Biomedical Engineering, IEEE Transactions on , vol.: 44 , Issue: 11 , Nov. 1997; pp.:1122 1127.*

* cited by examiner

Primary Examiner—Paul D Kim
(74) Attorney, Agent, or Firm—Ware, Fressola, Van Der Sluys & Adolphson LLP (57) ABSTRACT

A method for forming a spiral inductor (11) or component of a transformer, compatible with very large scale integrated processing, that achieves a higher Q value without occupying more space by splitting at least one turn (13 51) as two or more crisscrossing or interwoven smaller-width turns (13a 13b 52 53 54 55). The at least one turn (51) may, for example, be split into four turns paired up to provide two pairs of two turns, and the turns of each pair may then be interwoven or crisscrossed, and then the two pairs may also be interwoven or crisscrossed. The splitting of a turn into two or more smaller-width turns results in the current being divided among the smaller-width turns.

9 Claims, 8 Drawing Sheets

METHOD FOR FORMING A SPIRAL INDUCTOR

FIELD OF THE INVENTION

The invention relates to integrated circuit inductors and transformers, and more particularly to spiral inductors and transformers having a high quality factor (called a Q value).

BACKGROUND OF THE INVENTION

Many digital and analog components and circuits have been successfully implemented in the silicon based integrated circuits. Such components include passive devices, such as resistors, capacitors, and inductors.

Implementing high quality factor (called high Q value) inductors that operate at high radio frequencies remains problematic in silicon-based very large scale integration (VLSI) integrated circuit semi-conductor chips. For microwave and wireless communications applications, it is desirable to integrate inductors and transformers monolithically on bulk silicon, silicon on insulator, or silicon on sapphire chips, Gallium-Arsenium or Germanium etc. For these applications, considerable innovation is necessary before adequate values of inductance as well as high Q values are obtained. The Q value of an inductor is given by the following equation:

$$Q = 2\pi \frac{\text{maximum energy stored}}{\text{energy dissipated per cycle}}, \quad (1)$$

Most structures and methods used for fabricating high Q value inductors and transformers in hybrid circuits, monolithic microwave integrated circuits, or discreet applications (for example at larger dimensions, with better metals, on lossless substrates, etc.) are not readily compatible with silicon VLSI processing. U.S. Pat. No. 6,114,937 to Burghartz et al provides various references to conventional high Q value inductor fabrication methods.

Conventional inductors and transformers on silicon, which have strictly planer structures and are fabricated with conventional silicon fabrication processes and material, suffer from several limitations. First, conventional aluminum interconnect technology has a relatively high metal resistivity and limited metal thickness, both of which lead to a relatively high resistance of the spiral coil. The high resistivity lowers the quality factor Q, as seen from equation (1), because it contributes to the energy loss per cycle. Second, magnetic fields are strongly coupled to the silicon substrate, which is a lossy conductor with large skin depth even at radio frequencies. Induced currents in the silicon substrate act to oppose those in the spiral coil (the inductor) and cause what is known as the pinch effect (pinching off the current in the inductor), also lowering the Q value by contributing to the energy loss per cycle. In addition to the eddy currents in the substrate and the resulting pinch effect, neither of which are the focus of the present invention, in a planar inductor there are also currents induced in the metal windings of the planer spiral itself. Besides reducing the current in the spiral and so reducing the maximum energy stored per cycle and thus reducing the Q value of the spiral/inductor, the induced currents in the spiral dissipate energy stored in the windings (because they are an additional current flowing in a lossy medium, the coil material), with the result that, as shown by eq. (1), the Q value of the spiral is again reduced.

With a spiral inductor according to the prior art, portions of the innermost area of the spiral can actually have a negative current density (i.e. current in an opposite direction from the flow of the current overall). A negative current density occurs in the innermost branch of the spiral because the time-varying magnetic field is largest in the center turn of the spiral inductor. (More specifically, the current induced by the magnetic field caused by the current flowing in other parts of the spiral is strongest at the outer edge of the innermost turn of the spiral, and is in an opposite direction from the current in the rest of the spiral.)

To overcome some of the limitations of spiral inductors, toroidal inductors are used. Conventional multi-level interconnect technology allows fabrication of solenoidal or toroidal inductor structures instead of an inductor having a spiral configuration. Toroidal inductors have the benefit of confining the magnetic flux (to locations where there are no turns of the inductor), thereby minimizing substrate losses. However, conventional integrated toroidal inductors have comparably small inductance and Q values for a given silicon area relative to the planar spiral inductor configuration, because the area enclosed by wire windings of conventional toroidal inductors is small due to the limit in vertical dimensions of the thin films used in conventional VLSI processing.

Therefore, it is still advantageous in some respects to use a spiral inductor instead of a toroidal inductor, and it would be further advantageous to have a spiral inductor modified in a way that reduces induced currents in the spiral, i.e. in a way that reduces the tendency of current flowing in one part of the spiral to create a magnetic field through another part of the spiral, inducing currents there, and so reducing the net current there.

SUMMARY OF THE INVENTION

Accordingly, in a first aspect of the invention, a method is provided for forming a spiral inductor on a substrate, the method including a step of providing the substrate, the method characterized by: a step of providing the spiral inductor on the substrate so as to have at least one turn made up of at least two interwoven or crisscrossed smaller-width turns.

In accord with the first aspect of the invention, the at least one turn is made up of at least two pairs of interwoven or crisscrossed smaller-width turns, and the method is further characterized by a step of interweaving and crisscrossing the two pairs of interwoven or crisscrossed smaller-width turns.

Also in accord with the first aspect of the invention, the at least one turn may be made up of either an even number or an odd number of interwoven or crisscrossed smaller-width turns, and the method may be further characterized by a step of interweaving and crisscrossing the interwoven or crisscrossed smaller-width turns so as to each have substantially the same length. In further accord with the first aspect of the invention, each of the interwoven or crisscrossed smaller-width turns may be made to each have substantially the same length by arranging that each smaller-width turn occupies substantially the same positions relative to the center of the bundle formed by the smaller-width turns, and does so substantially the same number of times as each other smaller-width turn.

In a second aspect of the invention, a spiral inductor is provided made according to the first aspect of the invention.

In a third aspect of the invention, a transformer coil is provided made according to the method of claim 1.

In a fourth aspect of the invention, an integrated circuit including a spiral inductor is provided made according to the first aspect of the invention.

In a fifth aspect of the invention, an integrated circuit is provided including a transformer that in turn includes a transformer coil made according to the first aspect of the invention.

BRIEF DESCRIPTION OF THE DRAWINGS

The above and other objects, features and advantages of the invention will become apparent from a consideration of the subsequent detailed description presented in connection with accompanying drawings, in which.

BEST MODE FOR CARRYING OUT THE INVENTION

Figure 1A:
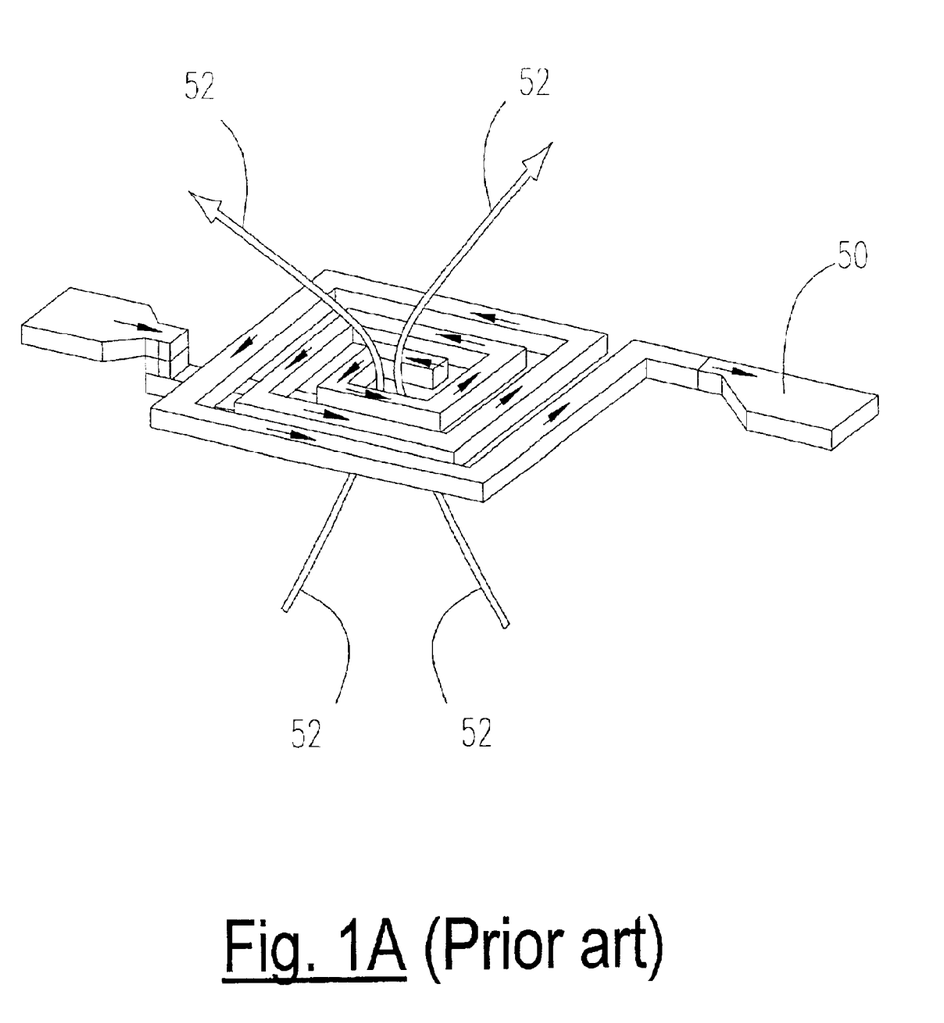
FIG. 1 is a perspective view of prior art spiral inductor and lines of magnetic fields generated by current flowing in the spiral inductor.
Figure 1B:
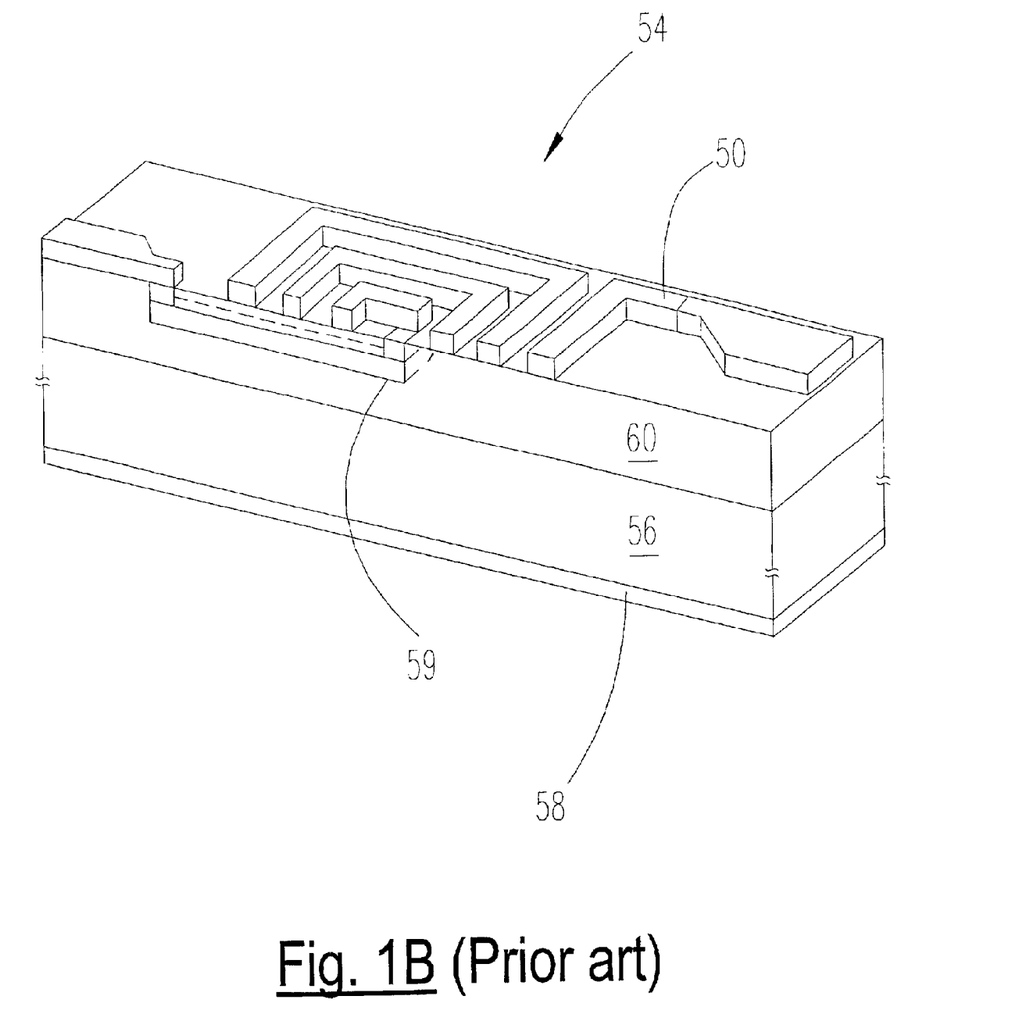
FIG. 1B is a cross-sectional view of the prior art spiral inductor of FIG. 1A.
Figure 2:
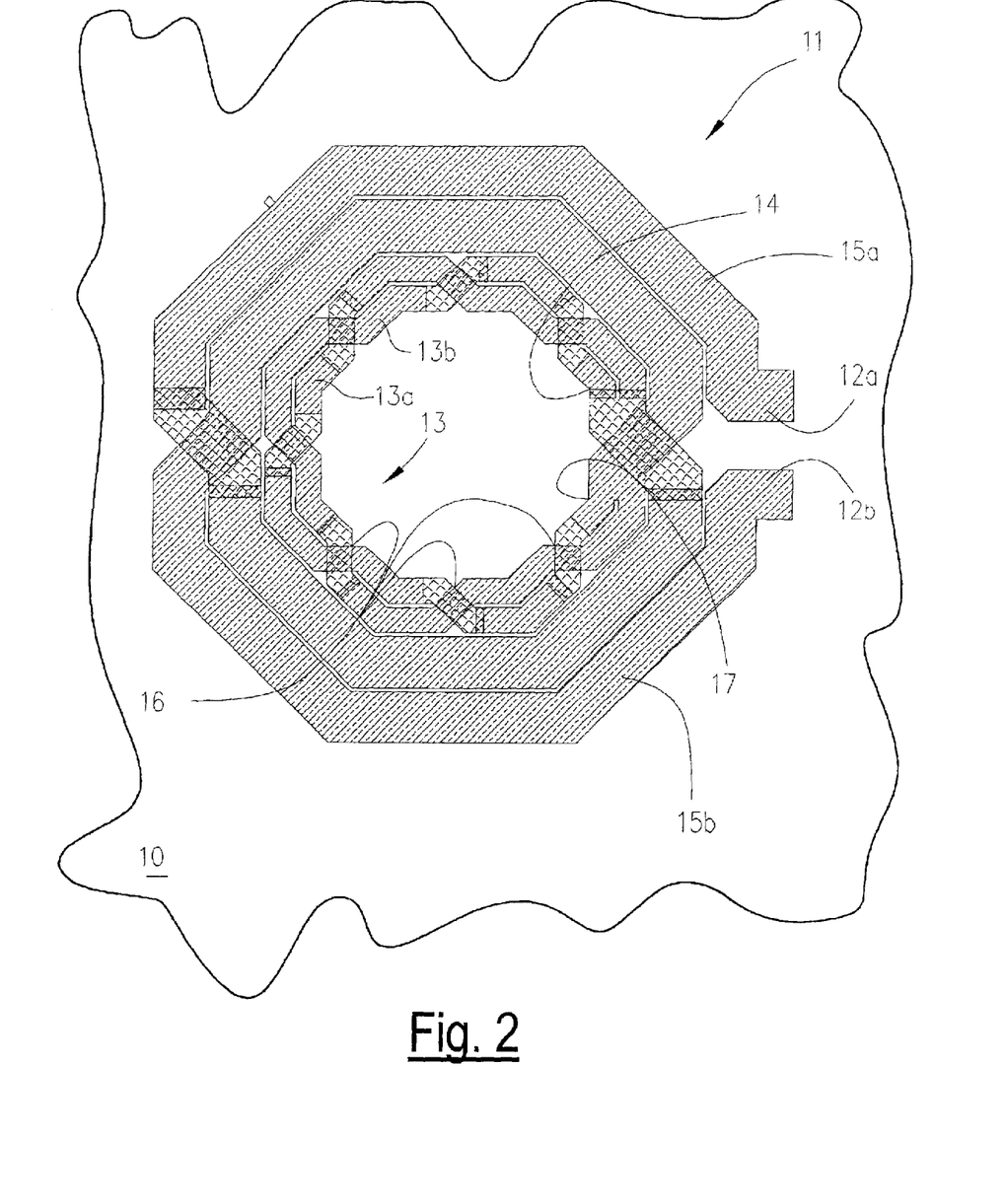
FIG. 2 is a plan (top) view of a spiral inductor according to the invention.

Referring now to FIG. 2, a spiral inductor 11 according to the invention is shown mounted on a silicon oxide layer 10 (like the silicon oxide layer 60 of FIG. 1B). The spiral inductor 11 is itself one or another type of good conductor (typically copper). The spiral inductor does not lie all in one plane (i.e. it is not strictly planar, but only substantially so), since some portions of it pass beneath other portions, and so are buried in the substrate, as illustrated for the prior art spiral inductor of FIG. 1B, showing a buried lead 59 making electrical contact with the innermost part of the spiral inductor 50.

Referring again to FIG. 2, the substrate 10 of a spiral inductor 11 according to the invention rests on top of a substrate (silicon) such as the substrate 56 of FIG. 1B, which in turn often rests on a conductive ground plane, such as the conductive ground plane 58 of FIG. 1B.

Still referring to FIG. 2, a spiral inductor 11 according to the invention is an out-in-out spiral in that it has both terminals 12a 12b on the outside of the spiral (so that the inductor must spiral in and then back out) as opposed to the out-in spiral of the prior art, which has one end on the outside of the spiral and one end on the inside (as in FIG. 1B). (The invention, though, does not rely on the spiral inductor being an out-in-out inductor; an out-in inductor could just as well be used, and the invention is also of use in transformer configurations.) The two arms 15a 15b of the spiral inductor 11 both spiral inward to an innermost branch/turn 13, which is split into two component paths 13a 13b, called here strands or smaller-width turns, which are then crossed over each other at several points 16 along the innermost turn of the spiral. In the case the terminal 12a is at a higher voltage than terminal 12b, current flows from terminal 12a along path 15a arriving at point 14, where it splits and divides up so as to flow along both strands 13a 13b (which have substantially the same impedance). At point 16, the current from the two component strands flows together again and ultimately emerges at the other terminal 15b.

Referring still to FIG. 2, by splitting the innermost turn of the spiral 11 into two crisscrossing strands 13a 13b, there is a reduction in the induced current in each strand because of a cancellation, described next, making use of FIGS. 3 and 4.

Figure 3:
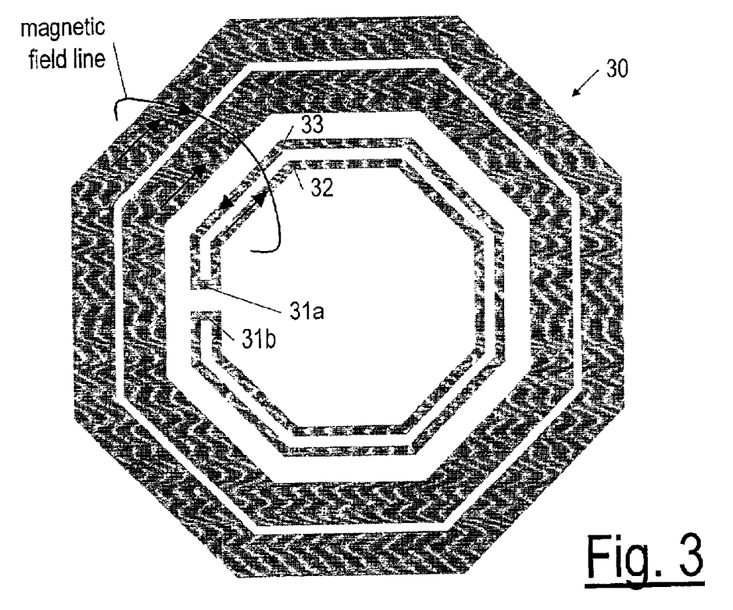
FIG. 3 is a schematic of a spiral inductor with a split but not twisted innermost turn (and so not according to the preferred embodiment of the invention)

Referring now also to FIG. 3, if a turn of a spiral 30 is split into an outer strand 33 and an inner strand 32 but the strands are not crisscrossed (i.e. the strands are as shown in FIG. 3), currents can still be induced because the two strands are not identical, the inner strand 32 being shorter than the outer strand 33, but are connected (at points 31a and 31b).

Figure 4:
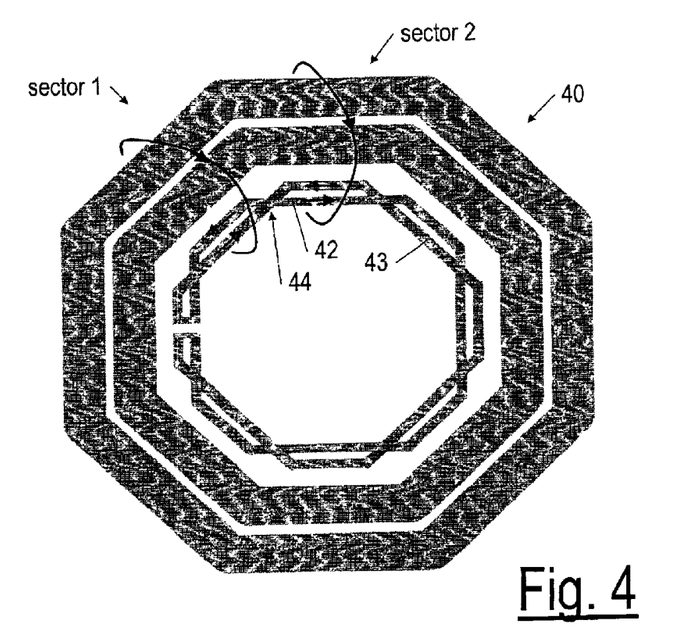
FIG. 4 is a schematic of a spiral inductor with a split and twisted innermost turn, according to the invention.

Referring now to FIG. 4, when the innermost two strands 42 43 of a spiral 40 are twisted, even though they are still connected, no net current is induced because the induced currents in the strands in each two adjacent pairs of sectors, separated by points of crisscross, exactly cancel each other since each strand is identical to the other over the length of two sectors. For example, in sector 1, the induced current in one strand 42 of the split innermost turn flows in one direction while in the other strand 43 of the split innermost turn, the induced current flows in the opposite direction, whereas in sector 2, delimited from sector 1 by the point 44 of crisscross, the reverse is true. Since the induced currents in the two sectors are equal an opposite, they cancel, i.e. the net induced current in each strand is zero.

It should be noted that for clarity of illustration, the interconnections of the different strands and turns of the spiral inductors of FIGS. 3 and 4, and also those of FIGS. 5, 6, 7A and 7B, are not shown but are implied.

For many applications, splitting the innermost turn of the spiral into two crisscrossing smaller-width turns (strands) is sufficient, but to further improve the Q value, the innermost turn can be split into more than two smaller-width, crisscrossed or interwoven turns (strands). The invention comprehends splitting a turn into any number of crisscrossed or interwoven strands, odd or even. The term interwoven is used here in respect to strands of a turn to indicate that the strands are braided in three dimensions, as opposed to being crisscrossed, by which we mean braided in two dimensions. In other words, interweaving two strands, as that terminology is used here, amounts providing them as a twisted pair, i.e. braiding them in three dimensions so that the path of one with respect to the other is over and under and over and under, and so on. Simply crisscrossing a pair of strands can be thought of as braiding them in two dimensions; one is always over the other, but the two strands continually crisscross. Thus, the terminology crisscrossing or interweaving (two or more strands) means here, braiding (two or more strands) in either two or three dimensions.

Figure 5:
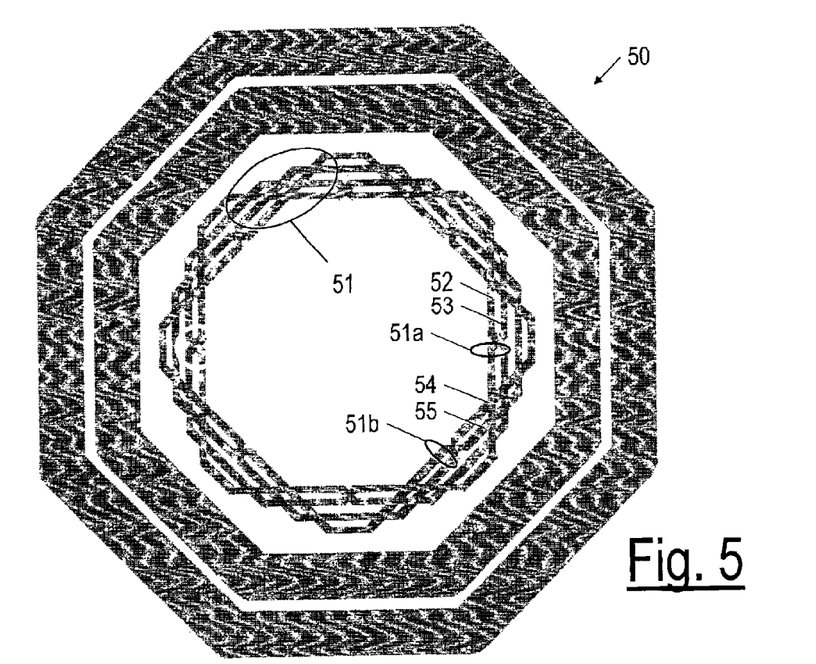
FIG. 5 is a schematic of a spiral inductor with the innermost turn split into four strands and which are then twisted, according to the invention.

Referring now to FIG. 5, a spiral inductor 50 according to the invention is shown where the innermost strand 51 is split into (i.e. provided as) a bundle 51 of fours twisted strands 52 53 54 55. The twisting should be done so that the entire bundle is twisted (as shown) pairwise and, in addition, each pair is twisted. In other words, with the turn 51 split or provided as four strands 52 53 54 55, first the adjacent strands 52 and 53 are crisscrossed or interwoven providing a twisted pair of strands 51a, and then the adjacent strands 54 and 55 are crisscrossed or interwoven providing a twisted pair of strands 51b. If the innermost strand 51 had been provided as eight strands, their would be a pairwise crisscrossing or interweaving of adjacent pairs of twisted pairs, and so on. If provided as six strands, first adjacent strands can be crisscrossed or interwoven providing three twisted pairs, and then the three twisted pairs can be crisscrossed or interwoven. Alternatively, first adjacent strands can be crisscrossed or interwoven in sets of three providing two crisscrossed or interwoven pairs, and then each of the two crisscrossed or interwoven pairs can be crisscrossed or interwoven. Other varieties of crisscrossing or interweaving more than two strands are also possible; what is important is that as a result of the various crisscrossings and interweavings, all strands have substantially the same length.

In splitting a turn into a number (even or odd) of strands, it is important to understand that the strands be arranged so that each strand occupies all the same locations the same number of times as all the other strands into which a turn is split, with the result that all the strands are substantially (but not necessarily exactly) the same length. It should be noted that so arranging the strands should not be considered a strict rule, but only a flexible guideline. If the guideline is not adhered to, the resulting coil is possibly not optimum, but it might be better than a conventional coil (i.e. one in which the turns are not split into strands).

Figure 6:
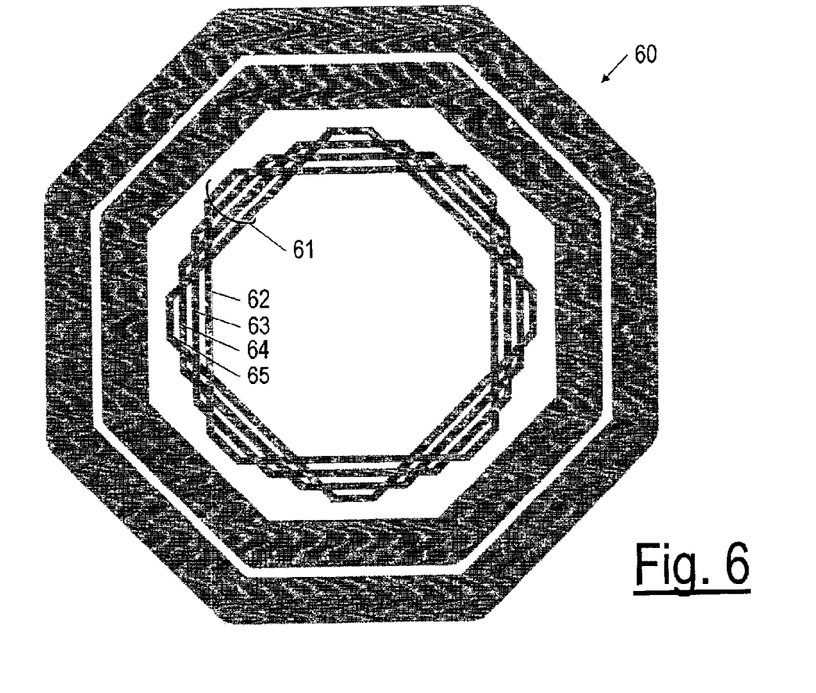
FIG. 6 is a schematic of a spiral inductor with the innermost turn split into four strands and then twisted but not according to the preferred embodiment of the invention.

Referring now also to FIG. 6, twisting an entire bundle 61 of a spiral inductor 60 alone does not give the greatest reduction in induced currents in the spiral; if only the entire bundle 61 is twisted, the two middle strands 63 and 64 would stay in the middle of the bundle all the way round the circle, while the two other strands, namely the strands 62 and 65, would alternate as the innermost and the outermost of the bundle 61, with the result that the induced current in the two other strands 62 and 65 would be larger than in the middle strands 63 and 64. The additional twist of a pair mixes the places of strands so that all the strands are identical when compared over the entire length of the bundle (i.e. over one complete loop/turn).

Figure 7A:
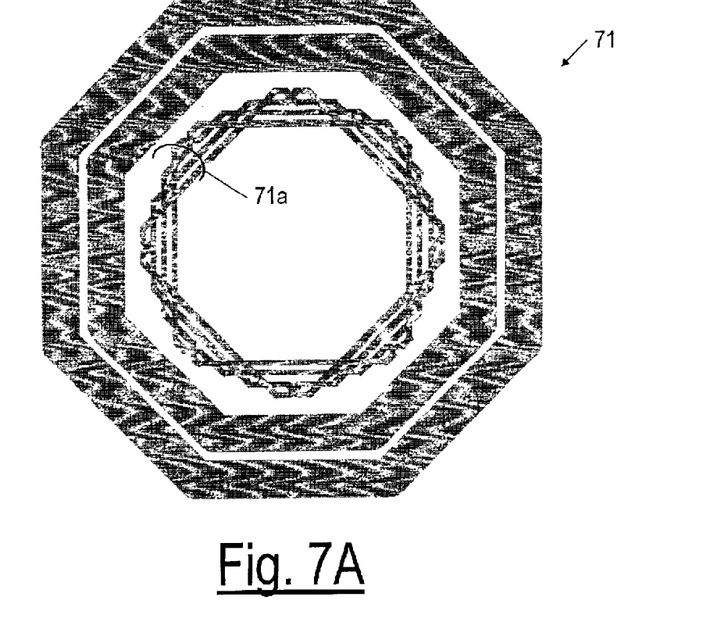
FIGS. 7A and 7B are schematics of a spiral inductor with the innermost turn split into four strands in different ways, all according to the invention.
Figure 7B:
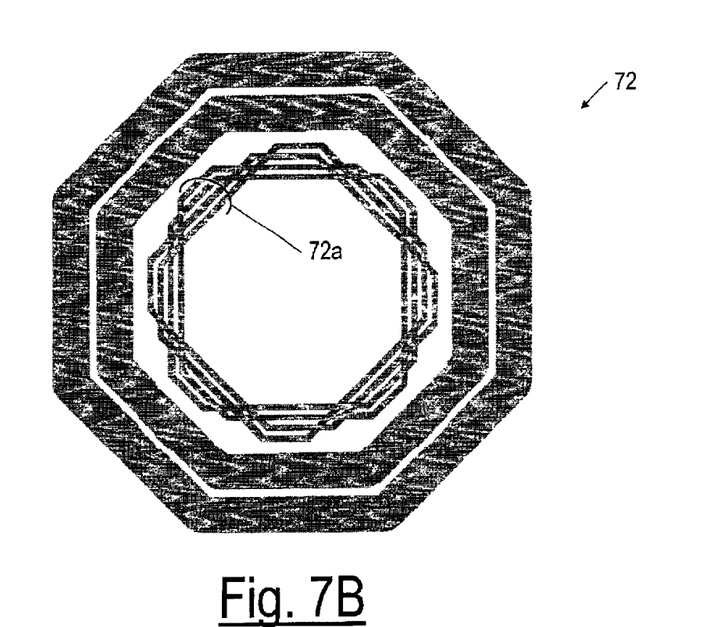

Referring now to FIGS. 7A and 7B, besides the configuration shown in FIG. 5, in case of splitting a turn into four strands, there are other advantageous configurations, such as the splitting and interweaving (or just crisscrossing) of the innermost turn resulting in the arrangement 71a of strands of the inductor 71 in FIG. 7A, or the splitting and interweaving (or just crisscrossing) of the innermost turn resulting in the arrangement 72a of strands of the inductor 72 in FIG. 7B. In general, any arrangement in which each strand has the same length as at least one other strand, so that pairwise cancellation can occur, is advantageous and in accord with the invention.

Figure 8:
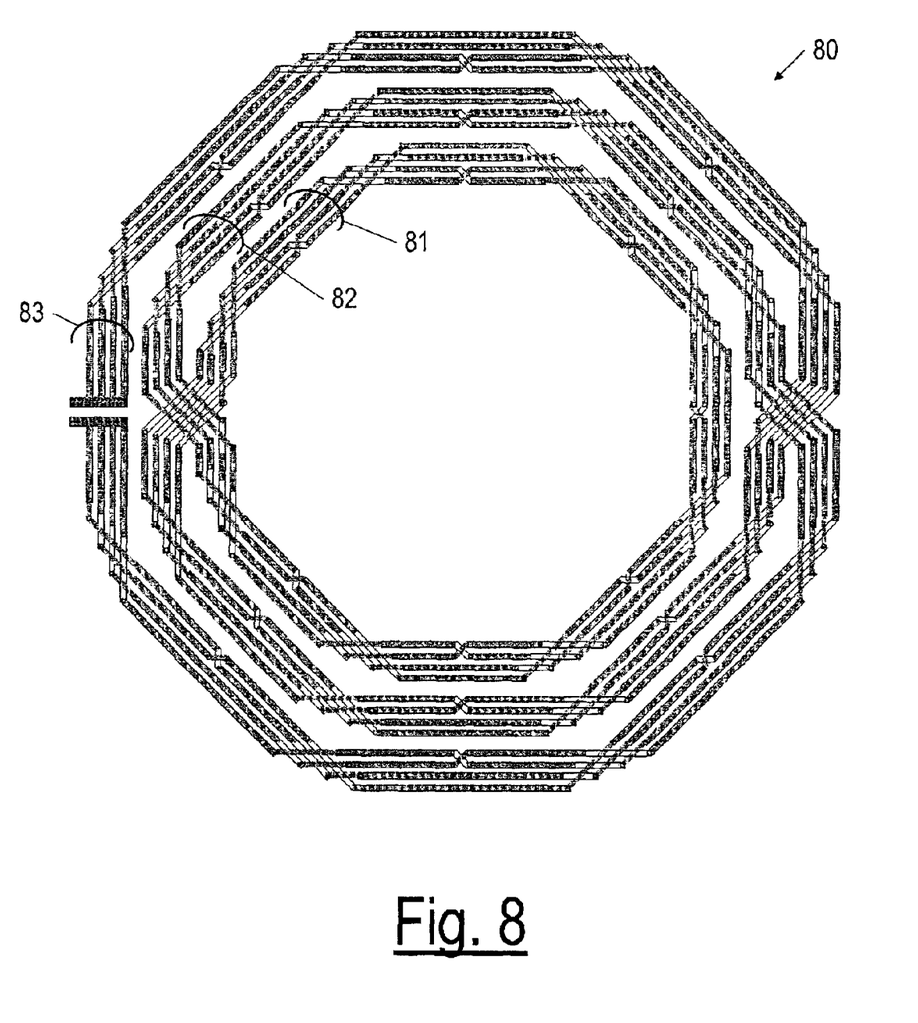
FIG. 8 is a schematic of a three-turn spiral inductor with each turn split into four strands that are then twisted, according to the invention.

Referring now to FIG. 8, a three-turn, four-strand spiral inductor 80 according to the invention is shown as including three turns each of which is split into a bundle 81 82 83 of four strands twisted as described above, i.e. so that for each turn, first the strands of the innermost pair are twisted, then the outermost pair, and then the two pairs are twisted.

Figure 9:
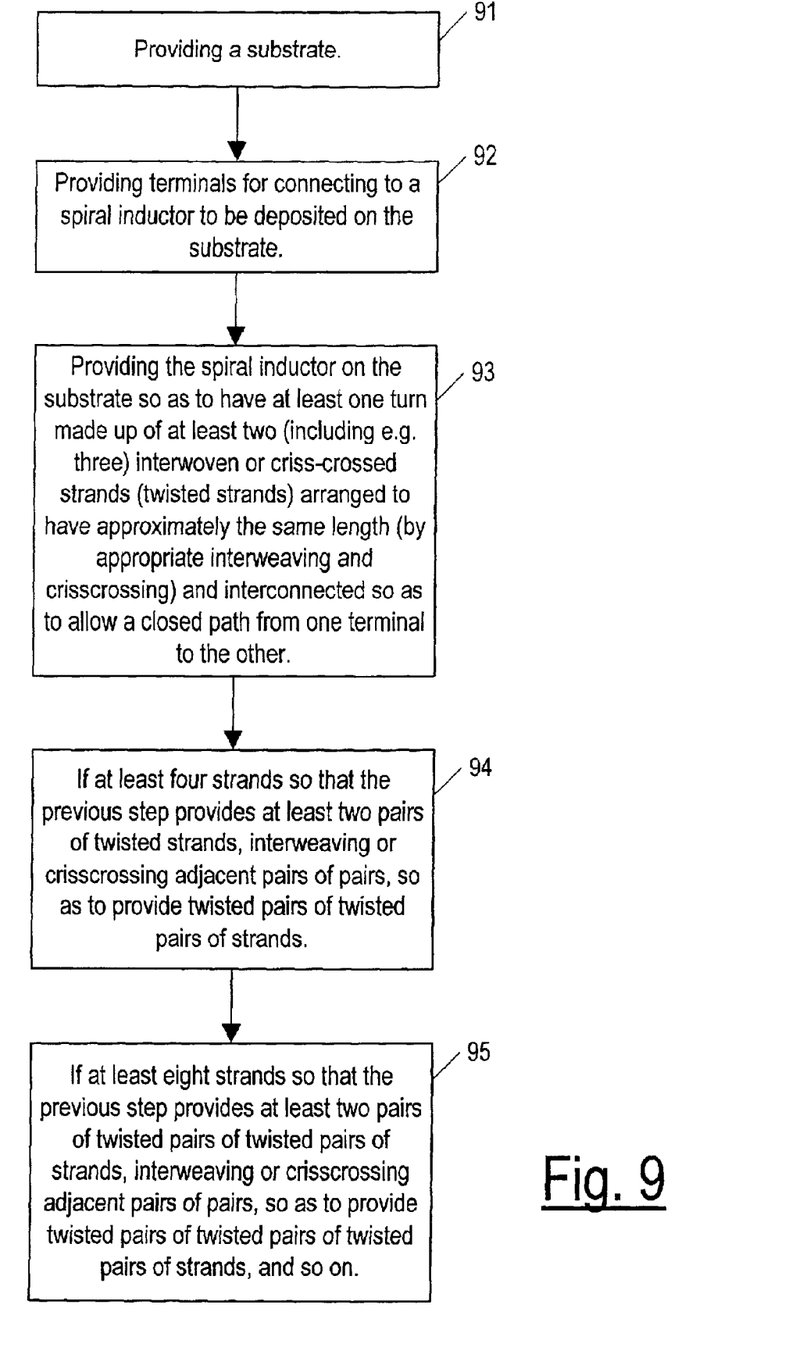
FIG. 9 is a flowchart illustrating a method for forming a spiral inductor, according to the invention.

Referring now to FIG. 9, a flowchart illustrating a method for forming a spiral inductor, according to the invention, is shown as including a first step 91 in which a substrate is provided (made preferably out of insulator material) on which the spiral inductor is to be formed, followed by a next step 92 in which terminals (or leads) are provided to allow connecting the spiral inductor to other circuit elements. Then, in a next step 93 the spiral inductor is formed on the substrate so as to have at least one turn made up of at least two interwoven or crisscrossed strands (an odd or even number of strands) having the same length and interconnected so as to allow a closed path from one terminal to the other. In case of splitting the at least one turn into a power of two that is more than two strands (e.g. 4 or 8 strands), in the step 93, the strands are, preferably, first interwoven or crisscrossed in pairs (providing twisted pairs of strands such as 51a and 51b of FIG. 5), then in a next step 94, the pairs of the pairs are interwoven or crisscrossed (providing twisted pairs of twisted pairs of strands, as shown in FIG. 5), and in a next step 95, pairs of the twisted pairs of twisted pairs of strands are interwoven or crisscrossed, and so on.

Scope of the Invention

It is to be understood that the above-described arrangements are only illustrative of the application of the principles of the present invention. Numerous further modifications and alternative arrangements besides those indicated above may be devised by those skilled in the art without departing from the scope of the present invention, and the appended claims are intended to cover such modifications and arrangements.

What is claimed is:

1. A method for forming a spiral inductor (11, 40, 50, 60, 70, 71, 72, 80) on a substrate (10), the method including a step (91) of providing the substrate (10), the method characterized by:
   a step (93) of providing the spiral inductor (11, 40, 50, 60, 70, 71, 72, 80) on the substrate (10) so as to have at least one turn (13 51) made up of at least two interwoven or crisscrossed smaller-width turns (13a 13b 52 53 54 55).

2. A method as in claim 1, wherein at least two turns (51) are each made up of at least two pairs (51a 51b) of interwoven or crisscrossed smaller-width turns (52 53 54 55), and the method is further characterized by a step of interweaving and crisscrossing the two turns of two pairs (51a 51b).

3. A method as in claim 1, wherein the at least one turn (51) is made up of either an even number or an odd number of interwoven or crisscrossed smaller-width turns (52 53 54 55), and the method is further characterized by a step of interweaving and crisscrossing the interwoven or crisscrossed smaller-width turns (52 53 54 55) so as to each have substantially the same length.

4. A method as in claim 3, wherein each of the interwoven or crisscrossed smaller-width turns (52 53 54 55) are made to each have substantially the same length by arranging that each smaller-width turn occupies substantially the same positions relative to center point of the bundle formed by the smaller-width turns, and does so substantially the same number of times as each other smaller-width turn.

5. A spiral inductor (11), comprising:
   a substrate; and
   one or more turns of a conductor material;
   wherein at least one of the turns is itself comprised of at least two interwoven or crisscrossed smaller-width turns.

6. A transformer coil (11) comprising a spiral inductor as in claim 5.

7. An integrated circuit comprising a spiral inductor (11) as in claim 5.

8. An integrated circuit including a transformer comprising a spiral inductor as in claim 5.

9. A method, comprising:

a step of providing a substrate; and a step of providing turns of a conductor of a spiral inductor on the substrate, wherein the conductor is made to split into two or more strands for at least some length so that one or more turns of the spiral inductor are made up of at least two strands, and further wherein the strands are interwoven or crisscrossed;

thereby providing a spiral inductor in which current that would otherwise all be carried by the conductor is instead divided among the two or more strands.

* * * * *

UNITED STATES PATENT AND TRADEMARK OFFICE
CERTIFICATE OF CORRECTION

PATENT NO. : 6,922,128 B2
DATED : July 26, 2005
INVENTOR(S) : Ari Vilander et al.

It is certified that error appears in the above-identified patent and that said Letters Patent is hereby corrected as shown below:

Column 6,
Line 54, before "center" insert -- a --.

Signed and Sealed this

First Day of November, 2005

JON W. DUDAS
*Director of the United States Patent and Trademark Office*